Dec. 13, 1955 H. S. CRAUMER 2,727,147
PERMEABILITY TUNING SYSTEM
Filed July 27, 1951
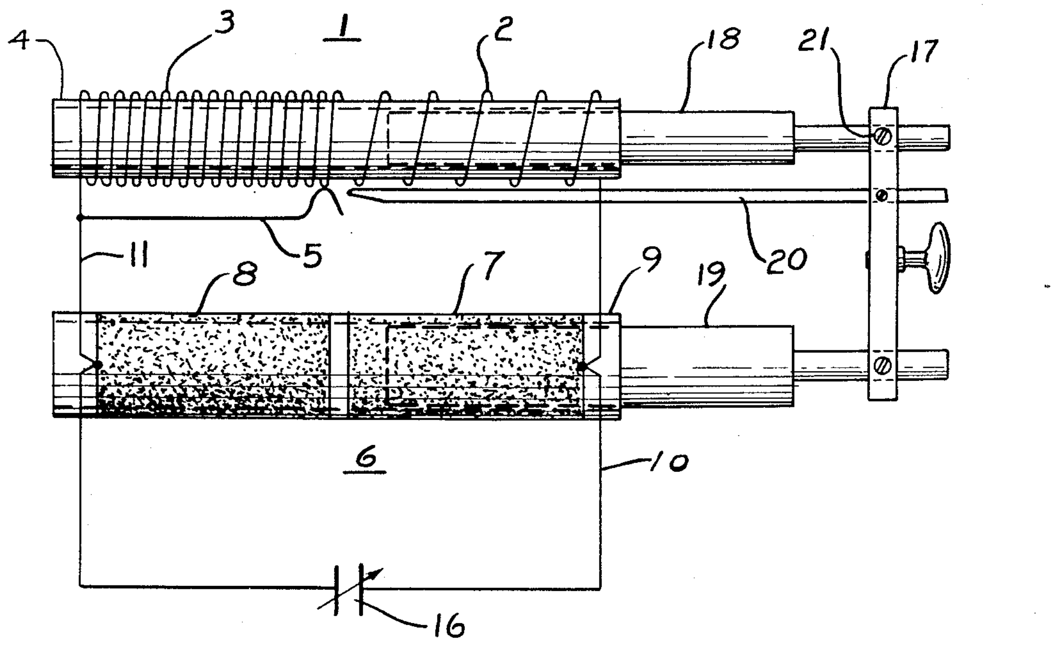
INVENTOR.
HENRY S. CRAUMER
BY Rolf E. Schneider
ATTORNEY.

United States Patent Office 2,727,147

Patented Dec. 13, 1955

2,727,147

PERMEABILITY TUNING SYSTEM

Henry S. Craumer, Bradford, Pa., assignor to Corning Glass Works, Corning, N. Y., a corporation of New York Application July 27, 1951, Serial No. 238,981

2 Claims. (Cl. 250—40)

This invention relates to variable permeability tuning systems and is particularly concerned with such systems in which continuous tuning is obtained by simultaneously varying an inductance and a capacity. The tuning system of this invention is applicable to radio receiving equipment in general, but is particularly useful in sets adapted to receive signals over a plurality of separate frequency bands, such as television receivers.

Prior tuning systems have not been entirely satisfactory for a number of reasons. Fixed tuning systems, such as employed in push-button tuning, involve complicated extensive wiring and multiple switches, making them expensive and difficult to assemble and to maintain in proper adjustment. Circuits designed for continuous tuning avoid this disadvantage within a single band or range of frequencies, but they also resort to undesirable switching arrangements in order to change from one band or channel to another or else waste a large amount of space tuning over unused portions of the spectrum between bands. The latter disadvantage is particularly serious in television reception wherein the several transmitting channels are separated from each other by varying amounts. Furthermore, most tuning systems are unable to maintain uniform distribution or spread over a range of frequencies and tend to be severely crowded at the higher frequencies.

It is the primary purpose of this invention to provide an inexpensive, compact continuous tuning system which avoids or greatly minimizes the undesirable features of prior systems as set forth above. A further purpose is to provide a continuous tuning system having a high inductance to capacitance ratio, particularly at the higher frequencies.

My invention will be best understood by reference to the accompanying drawing which shows in schematic fashion a tuning system constructed in accordance therewith.

Briefly stated, the tuning system as depicted comprises a circuit including an induction coil 1 of variable inductance, a tandem-type split-stator condenser 6, and a trimmer condenser 16 with means for simultaneously varying the inductance and the capacity of the system.

Induction coil 1 is wound in helical fashion about a tube 4, the winding consisting of two connected sections 2 and 3. The angle at which the winding is pitched differs in the two sections in a manner to provide a greater number of turns per unit length in section 3. The ratio in the particular coil turns, chosen for illustration, is 3 to 1, but is in no way critical and may be varied as individual desires dictate. A core 18 is projected into the end of tube 4 occupied by coil section 2. Also, a spring contactor 5 engages coil 1 at the juncture of sections 2 and 3, and serves as a shunt across section 3.

The variable condenser 6 includes two fixed electrodes or stator members 7 and 8, which may conveniently be cylindrical metallized areas on a tubular glass support 9, and a capacity-adjusting core 19. Induction coil 1 and the trimmer condenser 16 are electrically connected in parallel by conductors 10 and 11, and stator members 7 and 8 are in a series bridge across such conductors, respectively.

The tuning system shown is designed to cover a high frequency range, to skip a relatively large unused intermediate range, and to then cover a low frequency range. To provide for tuning of the system a movable bar or carrier 17 of electrical insulating material has adjustably fixed thereto by means of set screws, such as screw 21, the core 18, the core 19 and a rod 20 of insulating material adapted to remove the shunt from about coil section 3 by shifting the free end of contactor 5 away from such coil section as the changeover from the high frequency range to the low frequency range is about to occur.

As inward motion is imparted to bar 17, cores 18 and 19 are simultaneously moved into variable telescopic relation with sections 2 and 3 of induction coil 1 and the stators 7 and 8 of condenser 6, respectively. Passage of core 18 through the coil section 2 and passage of element 19 through the stator 7 of the condenser provide predominantly inductive tuning in the high frequency range. As core 19 bridges the space between the stators 7 and 8, core 18 enters section 3 of coil 1 and rod 20 engages contactor 5 and then moves it to break the shunt from about coil section 3. The net effect is a sudden increase in inductance, which inductance change serves to bridge the unused frequency gap with a minimum of tuning and without circuit switching. The low frequency range is then tuned by a combined inductance and capacity change.

Continued movement of the cores 18 and 19 within coil section 3 and within stator element 8 respectively provides tuning within the low frequency range.

The circuit is so designed that the inductance to capacity ratio, or L to C ratio as it is commonly referred to, is maintained virtually constant over the high frequency range. While this ratio decreases with the change to the low frequency range, it nevertheless is maintained at a very high level throughout such range.

It will be appreciated from the foregoing that my invention provides a simple, compact, continuous tuning system which is easy to operate and avoids the use of sliding contacts, or multiple switching arrangements. It is further characterized by a single tuning circuit for multiple bands, by a uniform displacement of frequencies, and by a high inductance to capacitance ratio, particularly at high frequencies, as herein described.

I claim:

1. In a combined inductance and capacity tuner, an induction coil in the form of a helix, a resilient member forming a shunt about a number of turns of said coil, a condenser comprising two tubular axially aligned electrodes spaced from one another, a tuning circuit extending between said inductance and said condenser, tuning elements adapted to be variably advanced into the bores of said coil and electrodes respectively to initially simultaneously change the inductance of the unshunted turns of said coil and the capacity of but one electrode of said condenser, a common carrier for said tuning elements, rod means secured to said carrier for displacing said member to remove the shunt from about the shunted coil turns when a maximum possible change in the inductance of the unshunted turns thereof has been effected by its tuning element, said elements being only thereafter available for simultaneously changing the inductance of the remaining turns of said coil and the collective capacity of said electrodes.

2. A combined inductance and capacity tuner as defined by claim 1 wherein each of said elements and said rod means is adjustably mounted on said carrier.

References Cited in the file of this patent

UNITED STATES PATENTS

| | | |
|---|---|---|
| 2,095,420 | Polydoroff | Oct. 12, 1937 |
| 2,163,644 | Ware | June 27, 1939 |
| 2,280,521 | Foster | Apr. 21, 1942 |
| 2,440,269 | Hargrove | Apr. 27, 1948 |
| 2,469,168 | Loughlin | May 3, 1949 |
| 2,562,263 | Ehrlich | July 31, 1951 |